United States Patent
Hogg et al.

(10) Patent No.: US 9,140,757 B2
(45) Date of Patent: Sep. 22, 2015

(54) TESTING A CIRCUIT ASSEMBLY THAT CONTAINS A PIEZOELECTRIC SWITCH

(71) Applicant: Essex Electronics, Inc., Carpinteria, CA (US)

(72) Inventors: Douglas Hogg, Santa Barbara, CA (US); John Echols, Santa Barbara, CA (US)

(73) Assignee: Essex Electronics, Inc., Carpinteria, CA (US)

( * ) Notice: Subject to any disclaimer, the term of this patent is extended or adjusted under 35 U.S.C. 154(b) by 379 days.

(21) Appl. No.: 13/851,758

(22) Filed: Mar. 27, 2013

(65) Prior Publication Data

US 2013/0257438 A1 Oct. 3, 2013

Related U.S. Application Data

(60) Provisional application No. 61/616,057, filed on Mar. 27, 2012.

(51) Int. Cl.
*G01R 31/327* (2006.01)
*H01H 11/00* (2006.01)
*H01H 36/00* (2006.01)

(52) U.S. Cl.
CPC ........ *G01R 31/3277* (2013.01); *G01R 31/3278* (2013.01); *H01H 11/0062* (2013.01); *H01H 36/0006* (2013.01)

(58) Field of Classification Search
CPC ........... G01R 31/3277; G01R 31/3278; H01H 11/0062; H01H 36/0006
USPC ......... 324/415, 419, 423, 424, 500, 527, 532, 324/537, 538, 629, 647, 649, 691, 705, 324/757.02, 763.01
See application file for complete search history.

(56) References Cited

U.S. PATENT DOCUMENTS

| | | | | |
|---|---|---|---|---|
| 4,395,651 A | * | 7/1983 | Yamamoto | 310/317 |
| 2007/0146334 A1 | * | 6/2007 | Inokawa | 345/173 |
| 2010/0319434 A1 | * | 12/2010 | Weber et al. | 73/12.06 |
| 2013/0033266 A1 | * | 2/2013 | Goto et al. | 324/415 |
| 2014/0184231 A1 | * | 7/2014 | Chern et al. | 324/415 |

* cited by examiner

*Primary Examiner* — Hoai-An D Nguyen
(74) *Attorney, Agent, or Firm* — Leech Tishman Fuscaldo & Lampl; Kenneth D'Alessandro, Esq.

(57) ABSTRACT

A method of testing a circuit assembly that includes a piezoelectric switch may include driving a DC current into the piezoelectric switch. The method may further include measuring the time interval it takes to develop a predetermined voltage across the piezoelectric switch and comparing the measured time interval with a first predetermined time interval and a second predetermined time interval. The method may include identifying the circuit assembly as defective when the measured time interval is either less than the first predetermined time interval or more than the second predetermined time interval, and otherwise identifying the circuit assembly is operational.

17 Claims, 1 Drawing Sheet

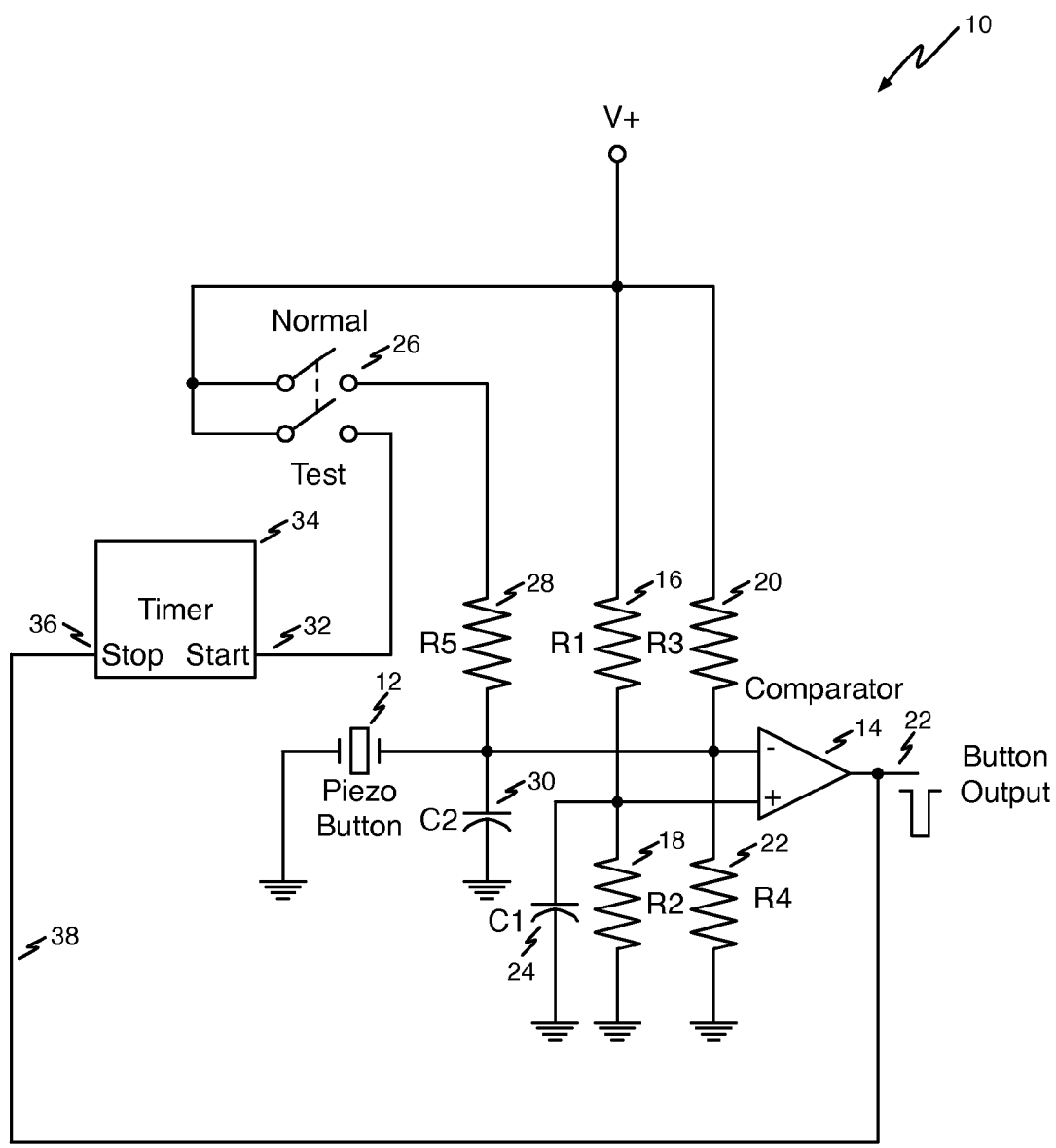

TESTING A CIRCUIT ASSEMBLY THAT CONTAINS A PIEZOELECTRIC SWITCH

CROSS-REFERENCE TO RELATED APPLICATION

This application claims the benefit of U.S. provisional patent application No. 61/616,057, filed on Mar. 27, 2012, the disclosure of which is incorporated by reference herein.

BACKGROUND

The present disclosure relates to electrical circuit assemblies. More particularly, the present disclosure relates to testing a circuit assembly that contains a piezoelectric switch. Piezoelectricity is the electric charge that builds up in certain solid materials and may be released in response to mechanical stress. Applying mechanical pressure to the piezoelectric material causes it output a voltage pulse that can be sensed by electronic circuits. Known methods and apparatus for testing circuits frequently rely on mechanical parts that are subject to increased wear over time when compared to piezoelectric materials. The electronics industry needs a more reliably way to test circuit assemblies.

BRIEF DESCRIPTION

In one embodiment, testing a circuit assembly that includes a piezoelectric switch may include driving a DC current into the piezoelectric switch. The piezoelectric switch may be or include a piezoelectric crystal. The method may further include measuring the time interval it takes to develop a predetermined voltage across the piezoelectric switch and comparing the measured time interval with a first predetermined time interval and a second predetermined time interval. The method may include identifying the circuit assembly as defective when the measured time interval is either less than the first predetermined time interval or more than the second predetermined time interval, and otherwise identifying the circuit assembly is operational.

In another embodiment, a circuit that tests circuit assemblies that include a piezoelectric switch may include a first circuit that applies a DC current to a piezoelectric switch. The circuit may include a second circuit that measures the time interval it takes to develop a predetermined voltage across the piezoelectric switch. The circuit may further include a third circuit that compares the measured time interval with a first predetermined time interval and a second predetermined time interval and that identifies the circuit assembly as defective when the measured time interval is either less than the first predetermined time interval or more than the second predetermined time interval, and otherwise identifying that the circuit assembly is operational.

BRIEF DESCRIPTION OF THE DRAWING FIGURES

FIG. 1 is an electrical diagram showing an exemplary embodiment of a circuit that tests circuit assemblies that include a piezoelectric switch.

DETAILED DESCRIPTION

Those of ordinary skill in the art will realize that the following description of the present invention is illustrative only and not in any way limiting. Other embodiments of the invention will readily suggest themselves to such skilled persons.

FIG. 1 shows an electrical diagram of an exemplary circuit that tests circuit assemblies that include a piezoelectric switch. The component values shown in the exemplary circuit of FIG. 1 are included for illustrative purposes. Persons of ordinary skill in the art will readily recognize that other component values may also be used. The optimal component values selected will depend on a number of design considerations commonly known by those in the electronics field. In one embodiment, a circuit 10 may include piezoelectric switch 12. In one embodiment, the piezoelectric switch 12 may be or include a piezoelectric crystal. The piezoelectric switch 12 may be connected between ground and the inverting input to a comparator 14. The non-inverting input to the comparator 14 may be connected to the common connection of resistors R1 and R2 at reference numerals 16 and 18 as a voltage divider between potential V+ and ground. High-value resistors R3 and R4, at reference numerals 20 and 22, may form a voltage divider to bias the inverting input of the comparator 14. A capacitor C1 at reference numeral 24 may be connected in parallel with resistor R2 to give the circuit some noise immunity.

The output of the circuit 10 may be line 22 at the output of the comparator 14. Pressing a button that may be mechanically coupled to the piezoelectric switch 12 may cause the piezoelectric switch 12 to output a voltage pulse that changes the state of the comparator 14. The negative-going output pulse appears at line 20 coupled to the output of comparator 14.

In another embodiment, the value of V+ may be 5V. The value of R1 may be 7.5 k-ohms. The value of R2 may be 10 k-ohms. The value of R3 may be 1 M-ohm. The value of R4 may be 1 M-ohm. The value of C1 may be 0.1 µF. Using these circuit parameters, the inverting input of comparator 14 may be biased at about 2.5V while the non-inverting input of comparator 14 may be biased at about 2.85V. Persons of ordinary skill in the art will immediately recognize that other component values could be chosen to bias the inputs of comparator 14 at different voltages.

In operation, embodiments of the piezoelectric switch test described herein may function such that when a DC voltage is applied to the piezoelectric switch 12, the piezoelectric switch 12 behaves like a capacitor. One pole of a normally-open double-pole single-throw test switch 26 may couple the V+ voltage to the piezoelectric switch 12 through resistor R5 at reference numeral 28 and C2 at reference numeral 30. The common connection of the RC network may be coupled to the inverting input of comparator 14. In such embodiments, the RC time constant of the circuit may be a function of the resistance of R5 and the total capacitance of the piezoelectric switch 12 in parallel with the capacitance C2, which in one embodiment may be about 100 pF. Persons of ordinary skill in the art will readily appreciate that a constant current source may be employed in place of a resistor.

In some embodiments, the other pole of the normally-open double-pole single-throw test switch 26 may couple V+ to a start input 32 of a timer 34. The output of the comparator 14 may be coupled to a stop input 36 of the timer 34 via line 38. The test switch 26 may be a mechanical switch or relay, or it may be a solid-state switch element formed from, for example, a bipolar or field effect transistor. The timer 34 may be a commonly-used timer such as a 555 timer integrated-circuit, or it may be implemented as a timer function of a microprocessor or microcontroller. In various embodiments in which the test switch 26 is a solid-state switch element, the microprocessor or microcontroller may be used to control the test switch 26.

By applying a voltage to the piezoelectric switch 12 and then timing how long it takes for the applied voltage to reach the trip point of the comparator 14, one can be determine that the piezoelectric switch 12 is either functioning and not damaged, or whether the opposite is true. If the rise time is faster than a first threshold value, which in one embodiment may be based on only R3 and C5, then the capacitance of the piezoelectric switch 12 did contribute to the RC time constant and the piezoelectric switch 12 has failed and is either damaged or open. If the rise time is slower than a second threshold value, which in one embodiment may be based on R3 and $C_{switch}$+ C2, then the piezoelectric switch 12 is likely to be shorted and has failed. A slow rise time could also indicate a poor electrical connection somewhere in the circuit, or a bad component other than the piezoelectric switch 12, such as the comparator 14. In any event, a slow rise time may identify the assembly as defective. Otherwise, the circuit may be identified as operational. In one embodiment, the first threshold may be less than or equal to about 1.8 ms, while the second threshold may be greater than or equal to about 100 ms. In various embodiments in which the piezoelectric switch is or includes a piezoelectric crystal, $C_{switch}$ may be equal to $C_{crystal}$.

While illustrative embodiments have been disclosed herein, persons ordinarily skilled in the art will realize that other embodiments employing the inventive principles disclosed herein are possible, and such embodiments will readily suggest themselves to such skilled persons. Accordingly, the present invention should only be limited within the spirit of the claims.

What is claimed is:

1. A method of testing a circuit assembly that includes a piezoelectric switch, comprising:
    driving a DC current into the piezoelectric switch;
    measuring the time interval it takes to develop a predetermined voltage across the piezoelectric switch;
    comparing the measured time interval with a first predetermined time interval and a second predetermined time interval; and
    identifying the circuit assembly as defective when the measured time interval is either less than the first predetermined time interval or more than the second predetermined time interval, and otherwise identifying the circuit assembly as operational.

2. The method of claim 1, wherein the piezoelectric switch is a piezoelectric crystal.

3. The method of claim 1, wherein measuring the time interval includes using a timer.

4. The method of claim 3, wherein the timer is implemented as a function of a microprocessor.

5. The method of claim 1, wherein the first and second predetermined time intervals indicate that the extent to which the capacitance of the piezoelectric switch contributed to an RC time constant of the circuit.

6. The method of claim 1, wherein the first predetermined time interval is less than or equal to about 1.8 ms.

7. The method of claim 1, wherein the second predetermined time interval is greater than or equal to about 100 ms.

8. A circuit that tests circuit assemblies that include a piezoelectric switch, comprising:
    a first circuit that applies a DC current to the piezoelectric switch;
    a second circuit that measures the time interval it takes to develop a predetermined voltage across the piezoelectric switch; and
    a third circuit that compares the measured time interval with a first predetermined time interval and a second predetermined time interval and that identifies the circuit assembly as defective when the measured time interval is either less than the first predetermined time interval or more than the second predetermined time interval, and that otherwise identifies the circuit assembly as operational.

9. The circuit of claim 8, wherein a single pole of a normally-open double-pole single-throw test switch couples the V+ voltage of the circuit to the piezoelectric switch through a resistor and a capacitor.

10. The circuit of claim 9, wherein the capacitance of the capacitor is about 100 pF.

11. The circuit of claim 9, wherein the test switch is a solid-state element.

12. The circuit of claim 9, wherein the test switch is controlled by a microprocessor.

13. The circuit of claim 8, wherein the third circuit includes a comparator with a V+ value of about 5V, a first resistor with a value of about 7.5 k-ohms, a second resistor with a value of about 10 k-ohms, a third resister with a value of about 1 M-ohm, and a fourth resister with a value of about 1 M-ohm.

14. The circuit of claim 9, wherein the comparator includes an inverting input biased at about 2.5V and a non-inverting input biased at about 2.85V.

15. The circuit of claim 8, wherein the piezoelectric switch is a piezoelectric crystal.

16. The circuit of claim 8, wherein the first predetermined time interval is less than or equal to about 1.8 ms.

17. The circuit of claim 8, wherein the second predetermined time interval is greater than or equal to about 100 ms.

* * * * *